United States Patent [19]
Yang et al.

[11] Patent Number: 5,760,446
[45] Date of Patent: Jun. 2, 1998

[54] ELECTROSTATIC DISCHARGE STRUCTURE OF SEMICONDUCTOR DEVICE

[75] Inventors: Hyang-ja Yang, Suwon; Hee-choul Park, Seoul, both of Rep. of Korea

[73] Assignee: Samsung Electronics Co., Ltd., Suwon, Rep. of Korea

[21] Appl. No.: 774,936

[22] Filed: Dec. 24, 1996

[30] Foreign Application Priority Data

Dec. 30, 1995 [KR] Rep. of Korea .................. 1995/69728

[51] Int. Cl.[6] ....................................... H01L 23/62
[52] U.S. Cl. ........................... 257/357; 257/358; 257/359; 257/360; 257/494
[58] Field of Search ........................ 257/357, 358, 257/359, 360, 494, 495

[56] References Cited

FOREIGN PATENT DOCUMENTS

| | | |
|---|---|---|
| 0 384 396 A | 8/1990 | European Pat. Off. . |
| 0 428 067 A | 5/1991 | European Pat. Off. . |
| 58-165 369 A | 9/1983 | Japan . |
| 61-281 545 A | 12/1986 | Japan . |
| 62-109 354 A | 5/1987 | Japan . |
| 401243589 A | 9/1989 | Japan ............ 257/358 |
| 403276770 A | 12/1991 | Japan ............ 257/357 |
| 406232393 A | 8/1994 | Japan ............ 257/357 |

*Primary Examiner*—William Mintel
*Attorney, Agent, or Firm*—Marger, Johnson, McCollom & Stolowitz, PC

[57] ABSTRACT

An electrostatic discharge structure of a semiconductor device is provided. The structure includes a semiconductor substrate doped with P-type impurities; an N-type well formed in a predetermined region of the semiconductor substrate; a P-type pocket well formed in a predetermined region of the N-type well; an N-type active guardline formed in the surface of the N-type well and doped to a concentration higher than that of the N-type well; a P-type active guardline formed in the surface of the P-type pocket well and doped to a concentration higher than that of the P-type pocket well; and an NMOS transistor formed in a surface of the P-type pocket well. Accordingly, even though a negative voltage due to electrostatic charge is temporarily applied to the drain region of the NMOS transistor, a malfunction of an internal circuitry formed in a P-type semiconductor substrate can be prevented.

4 Claims, 6 Drawing Sheets though the drawings show semiconductor memory devices having an address pad and an input/output pad. Also, the present invention can be employed in a general semiconductor device as well as the semiconductor memory device.

ELECTROSTATIC DISCHARGE STRUCTURE OF SEMICONDUCTOR DEVICE

BACKGROUND OF THE INVENTION

The present invention relates to a semiconductor device, and more particularly, to an electrostatic discharge structure of a semiconductor device having a P-type pocket well which has an NMOS transistor.

A semiconductor device includes, in general, a protection circuit, i.e., an electro-static discharge (ESD) circuit connected to each pad for absorbing a large externally applied voltage. In order to protect the internal circuitry of the semiconductor device from electro-static charge, the electro-static induced in the pad should be diverted through a power supply terminal or a ground terminal connected to an NMOS transistor of the ESD structure. Thus, the electro-static discharge circuit is an essential component of a semiconductor device.

FIG. 1 is a diagram of a conventional input protection circuit, and FIG. 2 is a sectional view taken along line 2—2' of FIG. 1.

Referring to FIGS. 1 and 2, the structure of a conventional input protection circuit, that is, the structure of an ESD circuit includes: an N-type well 12 formed in a predetermined region of a P-type semiconductor substrate 10; a heavily doped N-type active guardline 14 formed in the upper surface of the N-type well 12 in order to form an ohmic contact between the N-type well 12 and a metal interconnection (not shown) used to supply power supply voltage (Vcc) thereto; a heavily doped P-type active guardline 16 formed on the edge portion of the semiconductor substrate 10 surrounded by the N-type well 12 in order to lower the contact resistance between the P-type substrate 10 and a metal interconnection (not shown) connected to ground; an N-type source region 18 and an N-type drain region 22 formed in the surface of the semiconductor substrate 10 surrounded by the P-type active guardlines 16 and separated by a predetermined distance; and a gate electrode 20 formed on the upper surface of a gate insulating film (not shown) which is formed on the upper surface of a channel region located between the source region 18 and the drain region 22. Here, the source region 18, the drain region 22 and the gate electrode 20 constitute an NMOS transistor, and the source region 18 as well as the semiconductor substrate 10 are grounded. Also, the drain region 22 of the NMOS transistor is connected to an address pad 26 through an interconnection 24 and to an input terminal (not shown) of an internal circuit formed in another region of the semiconductor substrate 10, i.e., a gate electrode (not shown) of a logic circuit.

In the above conventional structure of the ESD circuit, when a large negative voltage due to electro-static charge is applied to an address pad 26, a forward bias voltage occurs between the P-type semiconductor substrate 10 and the N-type drain region 22. As a consequence, electrons of the drain region 22 are emitted into the semiconductor substrate 10. The electrons emitted into the semiconductor substrate 10 are diverted to the source region 18 or the N-type well 12, to thereby prevent a high voltage from being applied to the internal circuitry. This phenomenon occurs due to a parasitic bipolar transistor, wherein the drain region 22, the P-type semiconductor substrate 10, and the N-type well 12 act as the emitter, base, and collector, respectively. However, the electrons emitted into the semiconductor substrate 10 change the ground potential of the semiconductor substrate 10 to a negative potential (noise). This is called the undershoot phenomenon. Thus, the undershoot phenomenon leads to a malfunction of the internal circuitry formed in semiconductor substrate 10.

SUMMARY OF THE INVENTION

It is an object of the present invention to provide an electro-static discharge structure of a semiconductor device in which NMOS transistors for electro-static discharge (ESD) are formed in a P-type pocket well isolated from a P-type semiconductor substrate, to thereby prevent an internal circuit formed on the P-type semiconductor substrate from malfunctioning even though a negative voltage is applied to a drain region of the NMOS transistor.

To accomplish the above object of the present invention, there is provided an electro-static discharge structure of a semiconductor device comprising: a semiconductor substrate doped with P-type impurities; an N-type well formed in a predetermined region of the semiconductor substrate; a P-type pocket well formed in a predetermined region of the N-type well; an N-type active guardline formed in the surface of the N-type well and doped to a concentration higher than that of the N-type well; a P-type active guardline formed in the surface of the P-type pocket well and doped to a concentration higher than that of the P-type pocket well; and an NMOS transistor formed in a surface of the P-type pocket well.

Preferably, an address pad connected to the drain region of the NMOS transistor and an input/output pad connected to the drain region of the NMOS transistor are further comprised.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Hereinafter, each embodiment of the present invention will be described in detail with reference to the accompanying drawings. Here, the drawings show semiconductor memory devices having an address pad and an input/output pad. Also, the present invention can be employed in a general semiconductor device as well as the semiconductor memory device.

Embodiment 1

Figure 3:
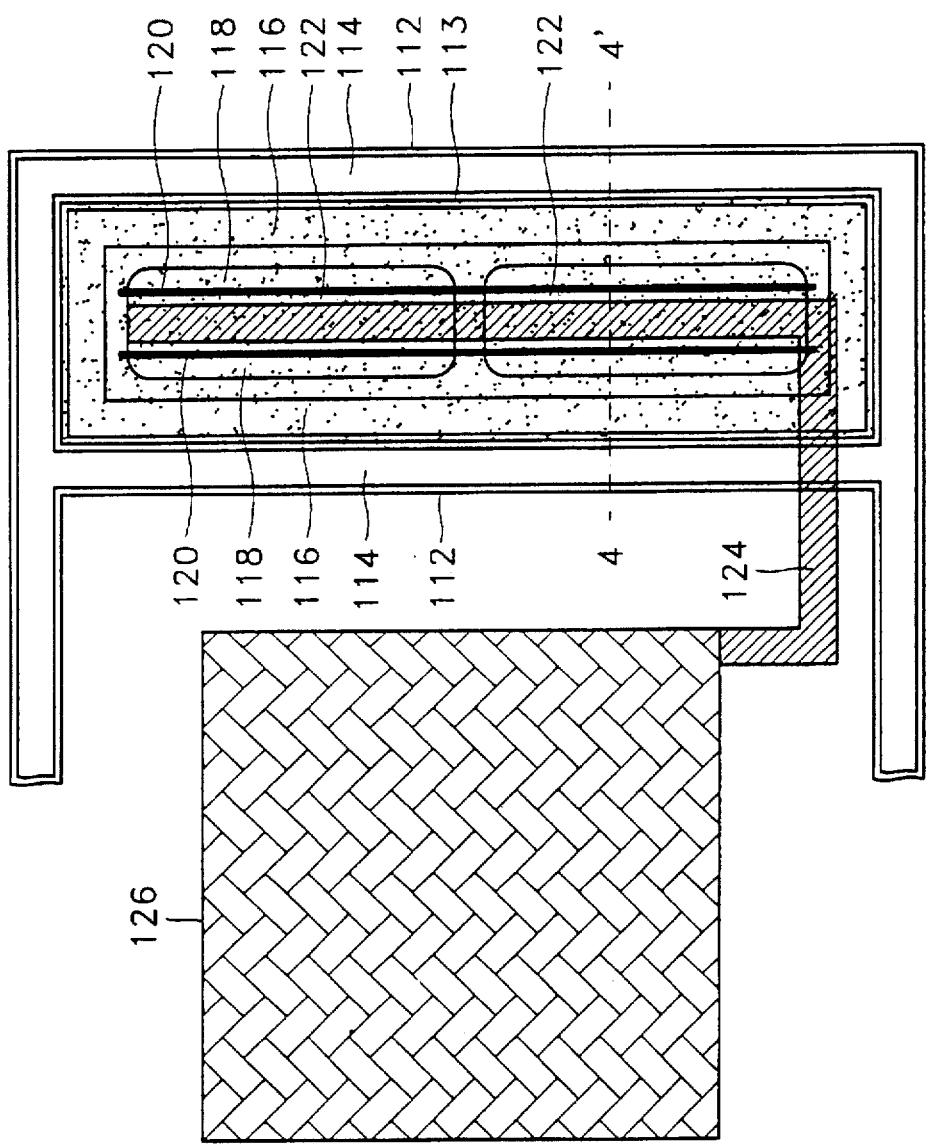
FIG. 3 is a diagram of an ESD structure having an address pad according to the present invention.
Figure 4:
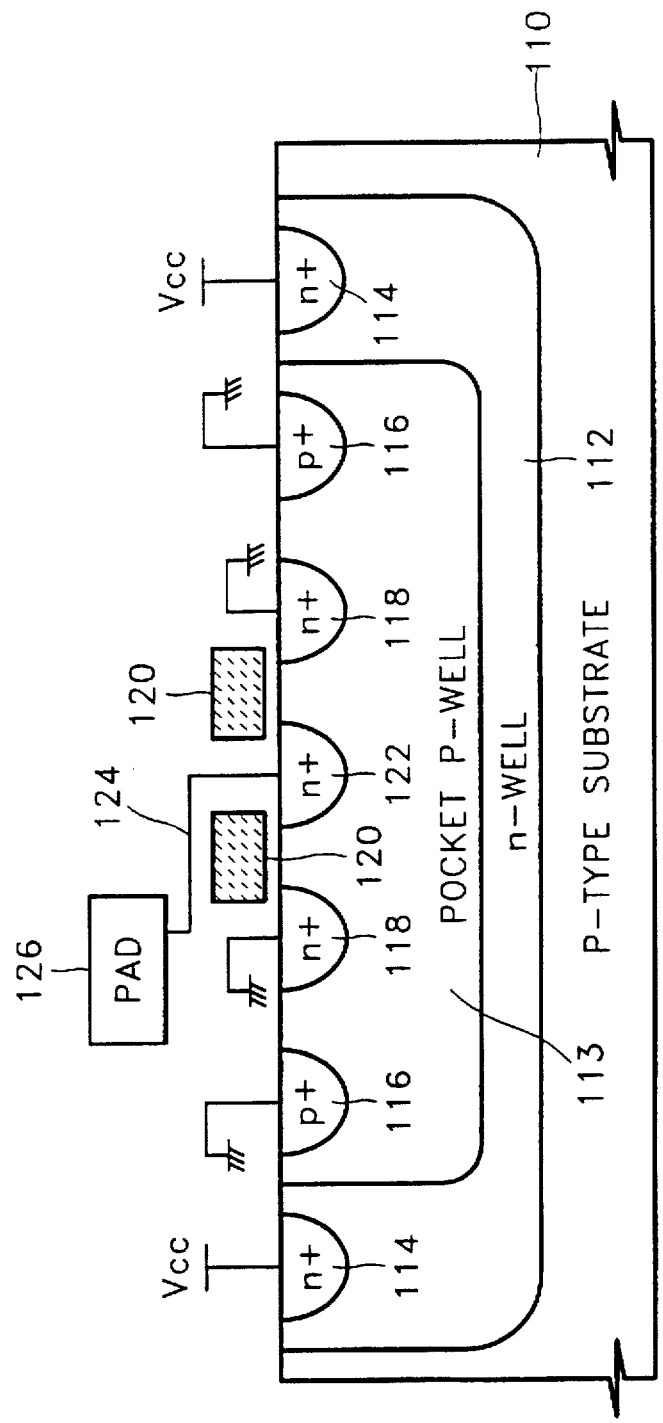
FIG. 4 is a sectional view taken along line 4—4' of FIG. 3.

Referring to FIGS. 3 and 4, an ESD structure having an address pad according to the present invention includes: a P-type semiconductor substrate 110; an N-type well 112 formed in a predetermined region of the semiconductor substrate 110; a P-type pocket well 113 formed in a predetermined region of the N-type well 112; an N-type active guardline 114 doped to a concentration higher than that of the N-type well 112 and formed in the surface of the N-type well 112; and a P-type active guardline 116 doped to a concentration higher than that of the P-type pocket well 113 and formed in the upper surface of the P-type pocket well 113.

The N-type active guardline 114 should be doped at $1.0 \times 10^{18}/cm^3$ or higher in order to form an ohmic contact between the N-type well 112 and an interconnection (not shown), e.g., an aluminum pattern for applying the power supply voltage Vcc to the N-type well 112. Also, the P-type active guardline 116 should be doped at $1.0-10^{18}/cm^3$ or higher in order to decrease the contact resistance between the P-type well 113 and an interconnection (not shown), e.g., an aluminum pattern for connecting the P-type well 113 to ground.

The ESD structure having an address pad according to the present invention further includes: an N-type source region 118 and an N-type drain region 122 which define a channel region formed in the surface of a predetermined region of the P-type pocket well 113; a gate electrode 120 formed on a gate insulating film (not shown) above the channel region between the source region 118 and the drain region 122; and an address pad 126 connected to the drain region 122 through an interconnection 124. Here, the ground terminal is connected to the source region 118 as well as the P-type active guardline 116, and the source region 118, the drain region 122 and the gate electrode 120 constitute an NMOS transistor for ESD.

In the above ESD structure, an NMOS transistor is formed in the P-type pocket well 113 which is completely isolated from the P-type semiconductor substrate 110 by the N-type well 112 surrounding the P-type pocket well 113. Accordingly, even with a negative voltage temporarily applied to the address pad 126, the potential of the semiconductor substrate 110 is stable, i.e., stably grounded. In detail, when a negative voltage due to electro-static charge is temporarily applied to the address pad 126 of the ESD structure according to the present invention, a forward bias voltage occurs between the P-type pocket well 112 and the drain region 122 which causes electrons to be emitted from the drain region 122. Then, the electrons move to the power supply terminal or the ground terminal through the source region 118, the P-type guardline 116 and the N-type guardline 114, and, since the P-type pocket well 113 is surrounded by the N-type well 112, most of the electrons emitted into the P-type pocket well 113 are rapidly moved to the N-type well 112. Accordingly, the electrons emitted from the drain region 122 remain in the P-type pocket well 113 for an extremely short amount of time so that the potential of the P-type pocket well 113 is prevented from changing. Although all of the electrons emitted into the P-type pocket well 113 cannot be rapidly transmitted to the N-type well 112, the P-type semiconductor substrate 110 keeps a stable ground potential. This is because the P-type semiconductor substrate 110 is completely isolated from the P-type pocket well 113 by the N-type well 112. Accordingly, the internal circuitry (not shown) formed in the P-type semiconductor substrate 110 is protected from noise caused by undershoot.

Embodiment 2

Figure 5:
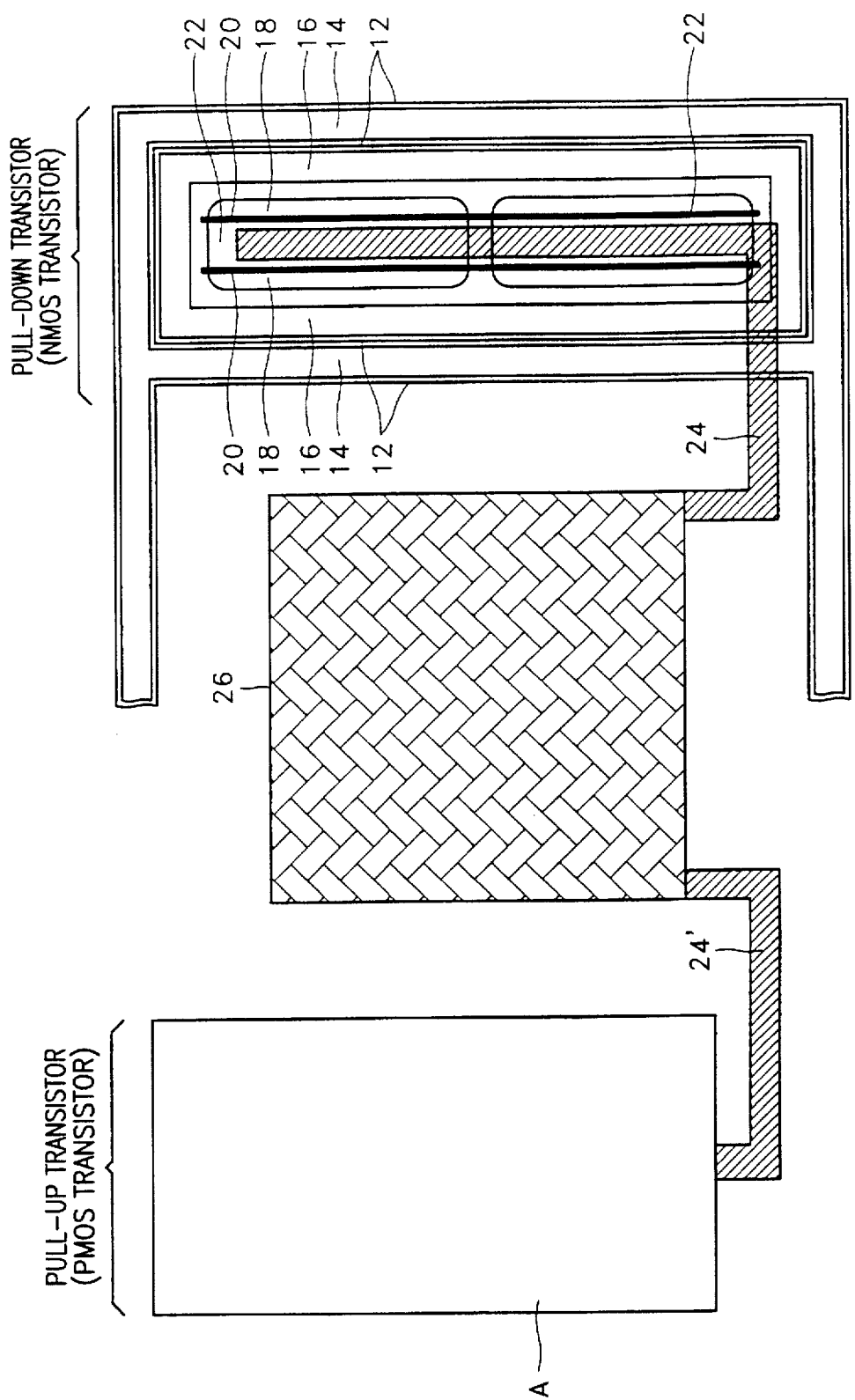
FIG. 5 is a diagram of a conventional ESD structure having an input/output pad.
Figure 6:
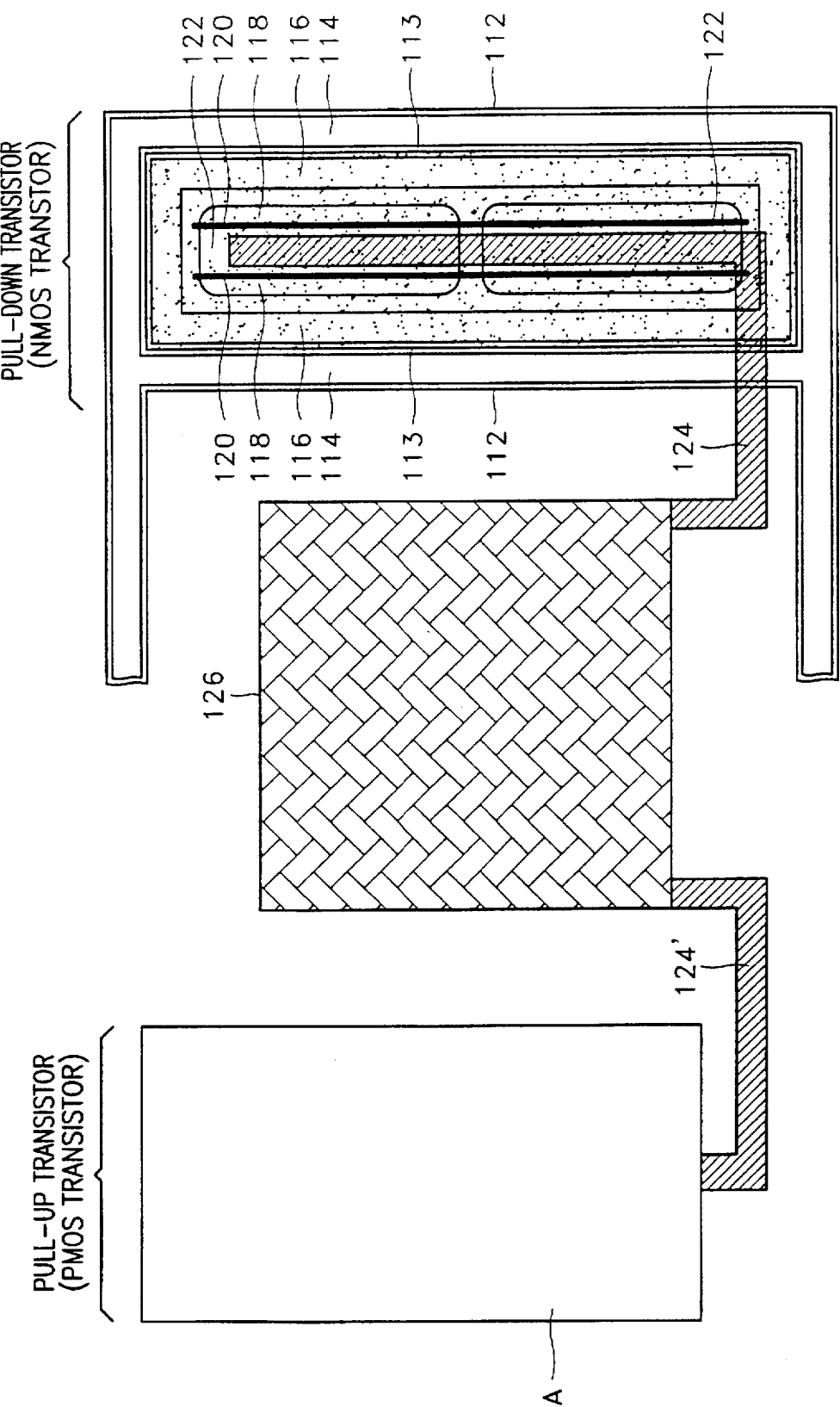
FIG. 6 is a diagram of an ESD structure having an input/output pad according to the present invention.

FIGS. 5 and 6 are diagrams illustrating an ESD structure having an input/output pad. The ESD structure is composed of a pull-up transistor portion formed of PMOS transistors and a pull-down transistor portion formed of NMOS transistors. FIG. 5 is a diagram showing a conventional ESD structure, and FIG. 6 is a diagram showing an ESD structure according to the present invention. Portions indicated by the same reference designations as those used in FIGS. 1 and 3 are the same; therefore, a detailed description thereof will be omitted.

Meanwhile, PMOS transistors have no direct influence on the undershoot phenomenon; therefore, only the pull-down transistor portion formed of NMOS transistors will be described.

Figure 1:
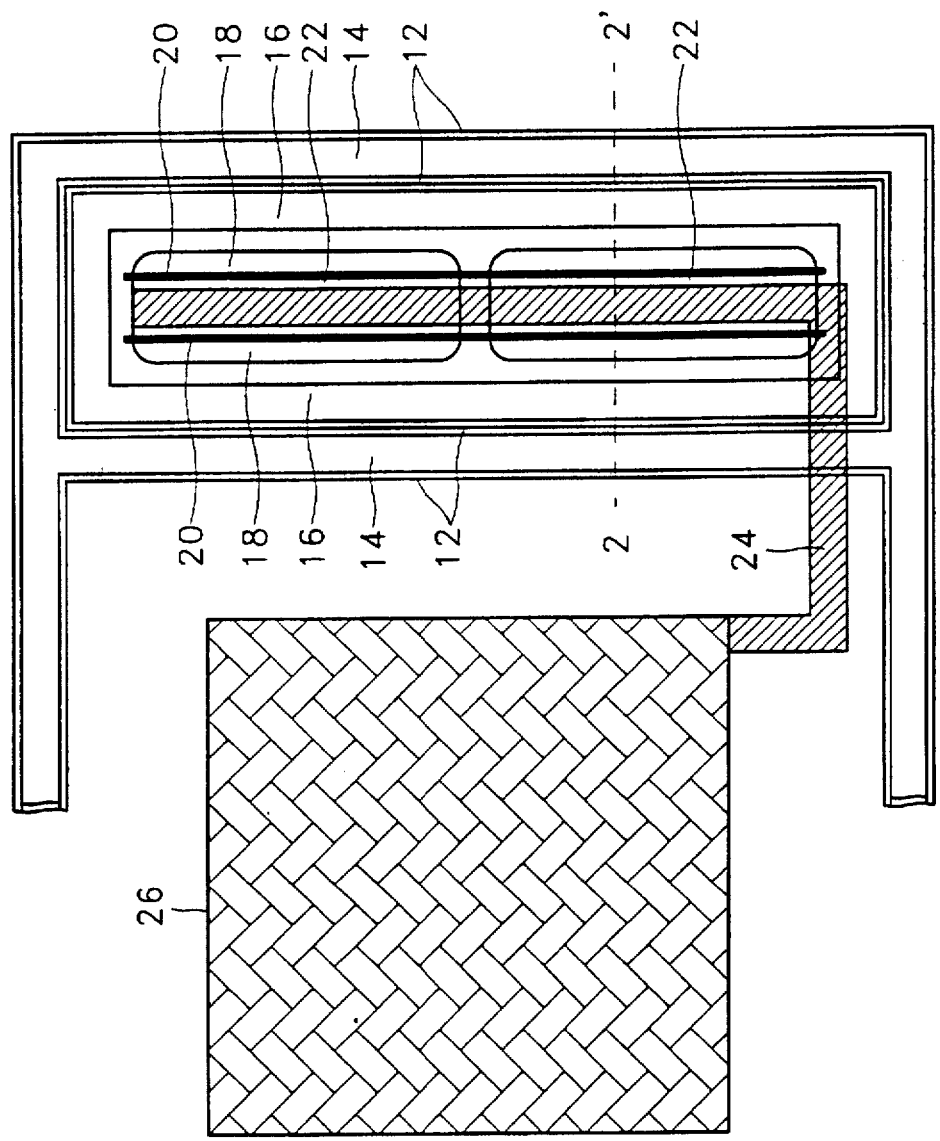
FIG. 1 is a diagram of a conventional ESD structure having an address pad.
Figure 2:
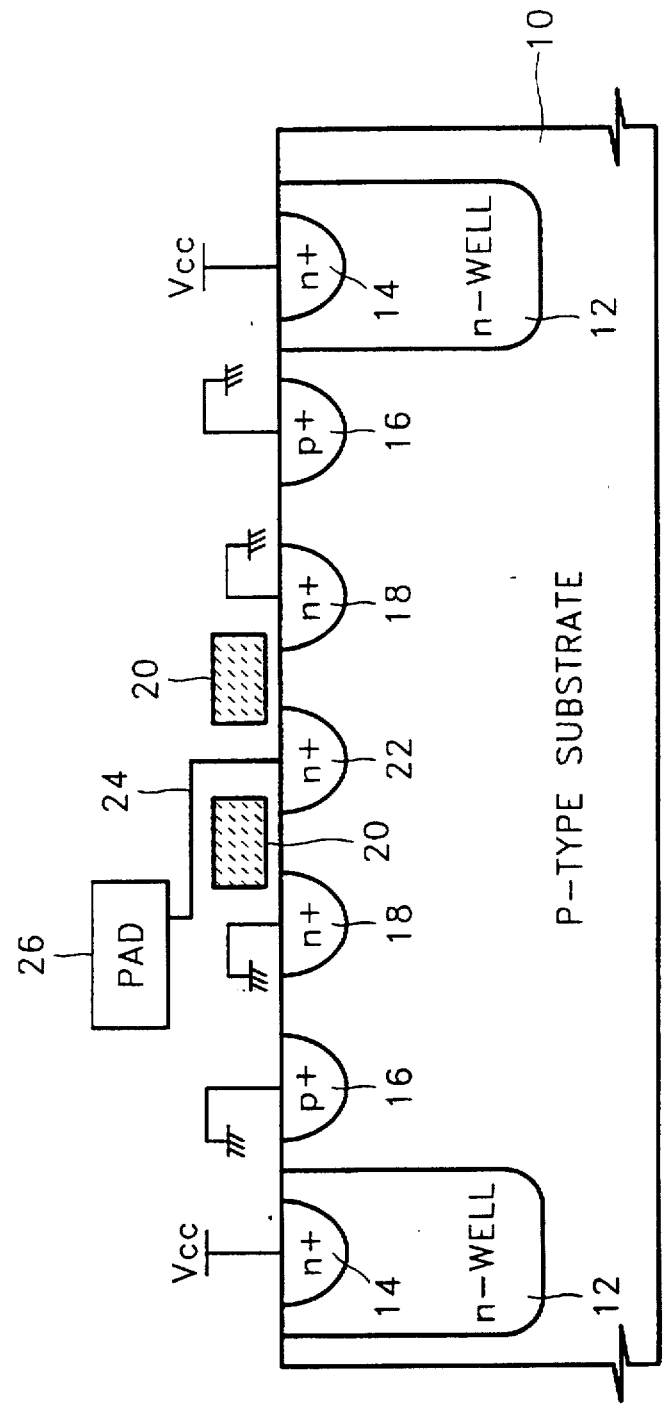
FIG. 2 is a sectional view taken along line 2—2' of FIG. 1.

Because the pull-down transistor portion of FIG. 5 is formed of NMOS transistors, the same problems as those described in FIGS. 1 and 2 occur. In order to solve such problems, the ESD structure described in FIGS. 3 and 4 is selected, to thereby obtain the same effect as that in the first embodiment.

Also, the present invention can be employed for an ESD structure having an input/output pad in which the pull-up transistor portion and the pull-down transistor portion are both formed of NMOS transistors. That is, in the case that the pull-up transistor portion and the pull-down transistor portion are formed of NMOS transistors, the NMOS transistor of the pull-up transistor portion as well as that for the pull-down transistor portion is formed in the P-type pocket well, to thereby obtain the same effect as that in the first embodiment.

As described above, according to the present invention, the NMOS transistors for ESD are formed in the P-type pocket well which is isolated from the semiconductor substrate, to thereby prevent a malfunction of the semiconductor device caused by undershoot.

It should be understood that the invention is not limited to the illustrated embodiment and that many changes and modifications can be made within the scope of the invention by a person skilled in the art.

What is claimed is:

1. An electrostatic discharge structure of a semiconductor device comprising:

a semiconductor substrate doped with P-type impurities;

an N-type well formed in a predetermined region of said semiconductor substrate;

a P-type pocket well formed in a predetermined region of said N-type well;

an N-type active guardline formed in the surface of said N-type well and doped to a concentration higher than that of said N-type well;

a P-type active guardline formed in the surface of said P-type pocket well and doped to a concentration higher than that of said P-type pocket well; and an NMOS transistor formed in a surface of said P-type pocket well.

2. An electrostatic discharge structure of a semiconductor device according to claim 1, wherein said N-type well is connected to a power supply terminal through said N-type guardline and said P-type pocket well is connected to a ground terminal through said P-type guardline.

3. An electrostatic discharge structure of a semiconductor device according to claim 2, further comprising an address pad connected to the drain region of said NMOS transistor.

4. An electrostatic discharge structure of a semiconductor device according to claim 2, further comprising an input/output pad connected to the drain region of said NMOS transistor.

* * * * *